United States Patent [19]
Matsuki et al.

[11] Patent Number: 6,149,976
[45] Date of Patent: Nov. 21, 2000

[54] METHOD OF MANUFACTURING FLUORINE-CONTAINING SILICON OXIDE FILMS FOR SEMICONDUCTOR DEVICE

[75] Inventors: Nobuo Matsuki; Johannes Bart Cornelis Van Der Hilst, both of Tokyo, Japan

[73] Assignee: ASM Japan K.K., Tokyo, Japan

[21] Appl. No.: 09/027,608

[22] Filed: Feb. 23, 1998

[30] Foreign Application Priority Data

Feb. 21, 1997 [JP] Japan ..................................... 9-052529

[51] Int. Cl.[7] .................................................. C23C 16/40
[52] U.S. Cl. .............................. 427/255.37; 427/255.39; 427/255.17
[58] Field of Search ......................... 427/255.18, 255.28, 427/255.37, 255.39, 255.393, 255.17

[56] References Cited

U.S. PATENT DOCUMENTS

| | | | |
|---|---|---|---|
| 5,300,460 | 4/1994 | Collins et al. | 427/534 |
| 5,362,526 | 11/1994 | Wang et al. | 427/573 |
| 5,661,093 | 8/1997 | Ravi et al. | 427/579 |
| 5,827,785 | 10/1998 | Bhan et al. | 438/784 |
| 5,876,798 | 3/1999 | Vassiliev | 437/255.7 |
| 5,908,672 | 6/1999 | Ryu et al. | 427/255.7 |

FOREIGN PATENT DOCUMENTS

| | | |
|---|---|---|
| 08330293 | 12/1996 | Japan . |
| WO 96/25023 | 8/1996 | WIPO . |

*Primary Examiner*—Shrive Beck
*Assistant Examiner*—Bret Chen
*Attorney, Agent, or Firm*—Knobbe, Martens, Olson & Bear, LLP

[57] ABSTRACT

The fluorine type silicon oxide film is formed using plasma CVD apparatus on a semiconductor wafer using a gas which is a mixture of a silicon source gas, a silicon type fluorine source gas, an oxidizing agent and an inert gas. The oxide film is formed using the inert gas at a flow which is at least five times the total flow rate of the silicon source gas and the silicon type fluorine source gas. Tetraethylorthosilicate (TEOS) is used as the silicon source gas; fluorotriethoxysilane (TEFS) is used as the silicon type fluorine source gas; oxygen ($O_2$) is used as the oxidizing agent; and a helium (He) or argon (Ar) gas is used as the inert gas.

5 Claims, 2 Drawing Sheets

METHOD OF MANUFACTURING FLUORINE-CONTAINING SILICON OXIDE FILMS FOR SEMICONDUCTOR DEVICE

BACKGROUND OF THE INVENTION

1. Field of the Invention

The present invention relates to the manufacture of a semiconductor device and, more particularly to a fluorine type silicon oxide film used as a layer insulation film and a method of manufacturing the same.

2. Description of the Related Art

Silicon oxide films ($SiO_2$) formed using plasma enhanced chemical vapor deposition (PE-CVD) have been widely used as insulation films of semiconductor devices. However, the trend toward finer devices at higher levels of integration has given rise to problems associated with burying performance and capacitance between wires and, as a result, silicon oxide films added with fluorine (F) (SiOF) having higher burying performance and lower relative dielectric constants have come into the spotlight as an alternative to $SiO_2$ described above.

The first method tried to produce an SiOF thin film was to cause plasma discharge of a gas which was a mixture of tetraethylorthosilicate (TEOS), oxygen ($O_2$) and $C_2F_6$ under a low pressure. However, an SiOF thin film produced using this method has a problem in that fluorine atoms therein are very unstable and easily liberated. Further, such fluorine atoms have high moisture absorption characteristics, which can lead to the generation of HF as a result of a reaction with water to corrode a semiconductor and thus can reduce the reliability of the semiconductor.

A technique for improving the quality of such an SiOF thin film is disclosed in articles "Application of SiOF Film Deposition Using TEOS/TEFS/$O_2$ System to Multi-Level Interconnection Designed with 0.25 μm Rule" by H. Kudo, Fujitsu and "DUAL FREQUENCY PLASMA CVD FLUOROSILICATE GLASS WAFER ABSORPTION AND STABILITY" by M. J. Shapiro, IBM and Toshiba which are incorporated herein as references. According to those articles, it was revealed that the unstableness and moisture absorption characteristics of fluorine atoms in a conventional SiOF film were significantly dependent upon the state of bonding between the fluorine atom and a silicon atom in the film. A major part of the fluorine atoms are diffused in a $SiO_2$ film at a low concentration in the range from 5 to 15% and are present in a SiOF film in a state expressed by (F—Si(—O—)$_3$) wherein Si atoms and F atoms are bonded in a one-to-one-relationship. However, a very small part of fluorine atoms are in a state expressed by (Si(—F)$_2$(—O—)$_2$) wherein one Si atom is bonded to two fluorine atoms. The above-described problem is attributable to the fact that fluorine atoms in this state of boding are very unstable from a chemical point of view. This problem becomes more and more serious, the higher the concentration of fluorine atoms in plasma.

The next method tried to mitigate this problem was to use fluorotriethoxysilane (TEFS) or $SiF_4$ instead of $C_2F_6$ described above as a fluorine source gas. Such silicon type fluorine source gases are characterized in that Si—F which is a bond between Si and F atoms in fluorine source gases is not dissociated by plasma. Specifically, a fluorine atom remains in the Si—F bonded state when it is absorbed into the SiOF film. This method makes it possible to reduce the number of free fluorine atoms present in plasma and, as a result, makes it possible to reduce the possibility of the formation of the unstable (Si(—F)$_2$(—O—)$_2$) state.

Although the unstableness of fluorine atoms has been thus significantly mitigated, this method has not been successful in obtaining satisfactory results with respect to the moisture absorption characteristics and quality of a film as a whole.

It is therefore an object of the invention to manufacture a fluorine type silicon oxide film in which fluorine atoms are stable.

It is another object of the invention to manufacture a fluorine type silicon oxide film having low moisture absorption characteristics.

It is a further object of the invention to manufacture a high quality fluorine type silicon oxide film having high compression stress.

It is a still further object of the invention to manufacture a semiconductor device which is manufactured at a low cost with high reliability.

SUMMARY OF THE INVENTION

In order to achieve the above-described objects, the present invention comprises the following means.

A fluorine type silicon oxide film using as a layer insulation film of a semiconductor integrated circuit is characterized in that it is formed using a gas which is a mixture of a silicon source gas, a silicon type fluorine source gas, an oxidizing agent and an inert gas.

Preferably, the flow rate of the inert gas is at least five times the total flow rate of the silicon source gas and the silicon type fluorine source gas.

Specifically, the silicon source gas is tetraethylorthosilicate (TEOS); the silicon type fluorine source gas is fluorotriethoxysilane (TEFS); the oxidizing agent is oxygen ($O_2$); and the inert gas is a helium (He) or argon (Ar) gas.

A method of manufacturing a fluorine type silicon oxide film for using as a layer insulation film of a semiconductor integrated circuit is characterized in that the film is formed using a gas which is a mixture of a silicon source gas, a silicon type fluorine source gas, an oxidizing agent and an inert gas.

Preferably, the flow rate of the inert gas is at least five times the total flow rate of the silicon source gas and the silicon type fluorine source gas.

Specifically, the silicon source gas is tetraethylorthosilicate (TEOS); the silicon type fluorine source gas is fluorotriethoxysilane (TEFS); the oxidizing agent is oxygen ($O_2$); and the inert gas is a helium (He) or argon (Ar) gas.

DETAILED DESCRIPTION OF PREFERRED EMBODIMENT

Figure 1:
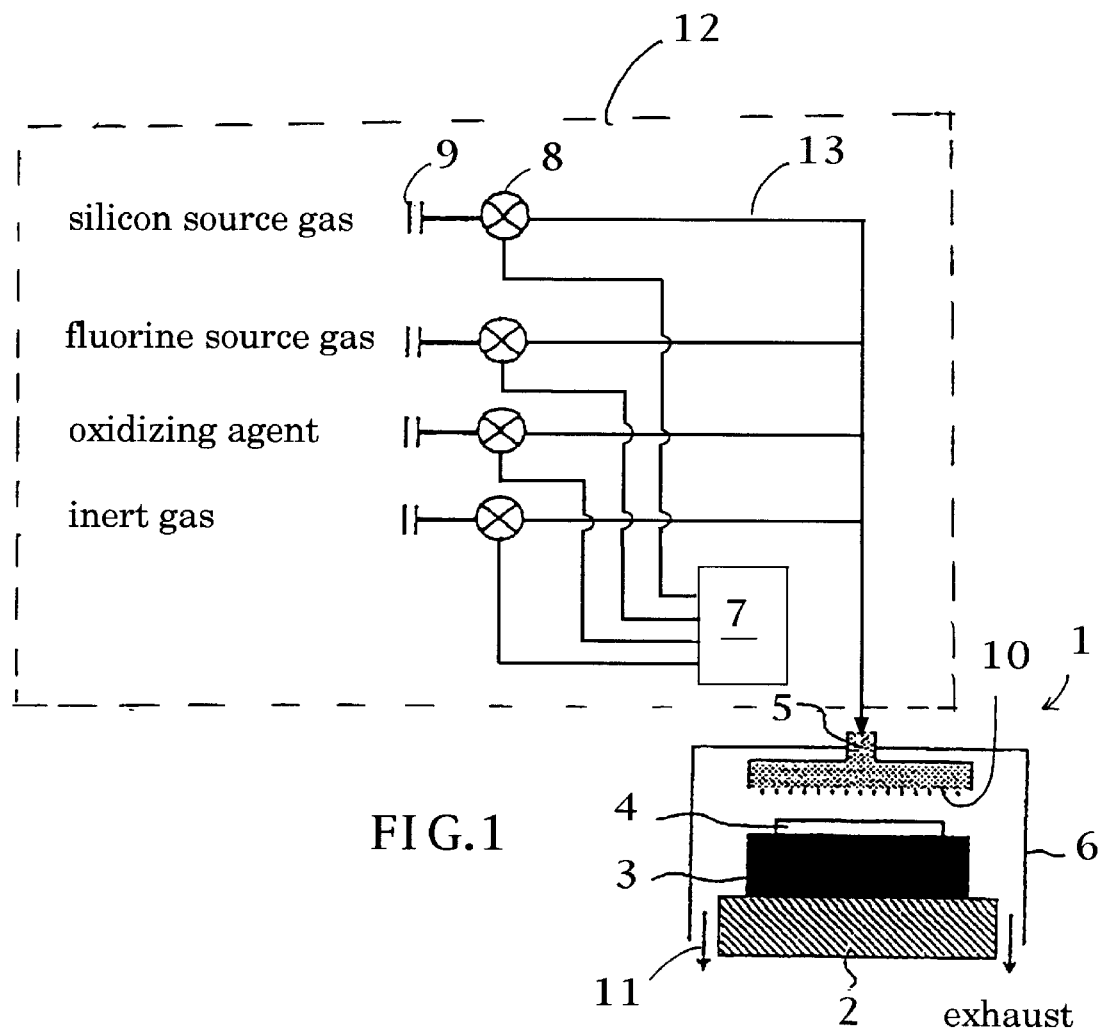
FIG. 1 schematically shows an apparatus for manufacturing a fluorine type silicon oxide film according to the present invention.

FIG. 1 schematically shows an apparatus for manufacturing a fluorine type silicon oxide film according to the present invention. The apparatus comprises a plasma CVD apparatus 1 and a gas supply apparatus 12. The plasma CVD apparatus 1 is a diode parallel plate type apparatus as in the prior art comprising a vacuum chamber 6, a gas supply head 5 provided at an inner upper part of the vacuum chamber 6, a susceptor 3 having a surface on which a semiconductor wafer 4 is placed, provided in parallel with the gas supply head 5 in a face-to-face relationship and a heater 2 supporting the susceptor for heating the semiconductor wafer 4 through the susceptor. In the conventional plasma CVD apparatus 1, the gas supply head 5 and susceptor 3 generally act as electrodes, and either of them is connected to an RF power supply (not shown). Plasma discharge formed in the vicinity of the surface of the semiconductor wafer 4 ionizes a mixed gas to cause a chemical reaction of the same and, as a result, a thin film is deposited on the semiconductor wafer.

The gas supply apparatus 12 comprises tanks 9, valves 8, lines 13 for various gases and a flow rate controller 7 for controlling the opening and closing of the valves 8 and the gas flow rates.

A fluorine type silicon oxide film (preferably SiOF) according to the present invention is manufactured from a gas which is a mixture of a silicon source gas, a silicon type fluorine source gas, an oxidizing agent and an inert gas. In a preferred embodiment of the invention, tetraethylorthosilicate (TEOS) is used as the silicon source gas; fluorotriethoxysilane (TEFS) is used as the silicon type fluorine source gas; oxygen ($O_2$) is used as the oxidizing agent; and helium (He) is used as the inert gas. Alternatively, triethoxysilane (TRIES) maybe used as the silicon source gas, and argon (Ar) may be used as the inert gas. Further, those gases may be used in combination.

When the gases flow from the respective gas tanks 9 through the lines 13 to the valves 8, the flow rate controller 7 controls the valves according to a preprogrammed procedure. At this time, the flow rate of the inert gas (He) is controlled such that it becomes at least five times the total flow rate of the silicon source gas (TEOS) and silicon type fluorine source gas as will be described in detail later. The gases in predetermined amounts achieved by such control are introduced through inlet ports 10 of the gas supply head 5 of the plasma CVD apparatus 1 into a pre-evacuated chamber 6 to be mixed therein. The mixed gas is ionized into a plasma state by plasma discharge that occurs at the gap between the gas supply head 5 and the susceptor 3. Then, as a result of a chemical reaction that occurs in the plasma of the mixed gas, a fluorine type silicon oxide film (preferably SiOF) is produced and deposited on the surface of the semiconductor wafer. Finally, any residual gas in the chamber 6 is discharged from an outlet port 11.

The inert gas (He) used here has an effect of promoting the ionization of molecules or atoms of other gases in the mixed gas to increase the density of the plasma. Further, it is also advantageous in that gaseous molecules of the inert gas ionized in the plasma collide with ions on the surface of the film during the process of film formation (ion bombardment) to make the film denser. The present invention is characterized in that the use of the inert gas having such a feature associating with the silicon type fluorine source gas provides a fluorine type silicon oxide film in which fluorine atoms are very stable and which has low moisture absorption characteristics and high compression stress.

Figure 2:
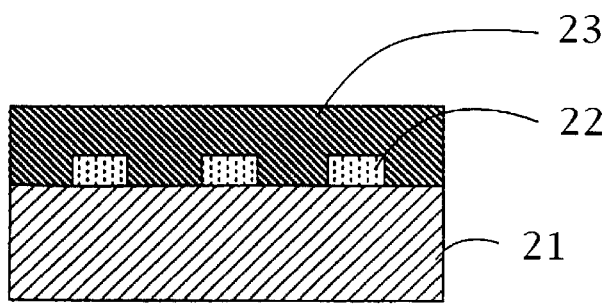
FIG. 2 is a schematic enlarged sectional view of a fluorine type silicon oxide film according to the present invention.

FIG. 2 is a schematic enlarged view of a part of the surface of a semiconductor wafer. An insulation film 21 made of SiOx or the like is formed on the bulk of a semiconductor device; a wiring layer 22 made of a metal such as aluminum is formed thereon; and a fluorine type silicon oxide film 23 according to the invention is further formed thereon. As another embodiment, another aluminum layer may be further formed thereon to provide multilayer wiring.

Next, the embodiment of the present invention will be described with reference to results of an experiment thereon. The experiment was carried out on a comparative example and the embodiment of the invention with respect to the moisture absorption characteristics and compression stress thereof as shown in Table 1 below.

TABLE 1

|  | TEOS | TEFS | $O_2$ | He |
|---|---|---|---|---|
| Comparative Example | 84 | 54 | 2000 | 0 |
| Embodiments |  |  |  | 1000, 2000 |

(flow rate sccm)

(1) Embodiment

The flow rate was 84 sccm for TEOS, 54 sccm for TEFS, 2000 sccm for $O_2$, and 1000 sccm (approximately 7 times the total amount of TEOS and TEFS) and 2000 sccm (approximately 14 times the total amount of TEOS and TEFS) for He.

(2) Comparative Example

The flow rate was 84 sccm again for TEOS, 54 sccm again for TEFS, 2000 sccm again for $O_2$, and 0 sccm for He.

Figure 3:
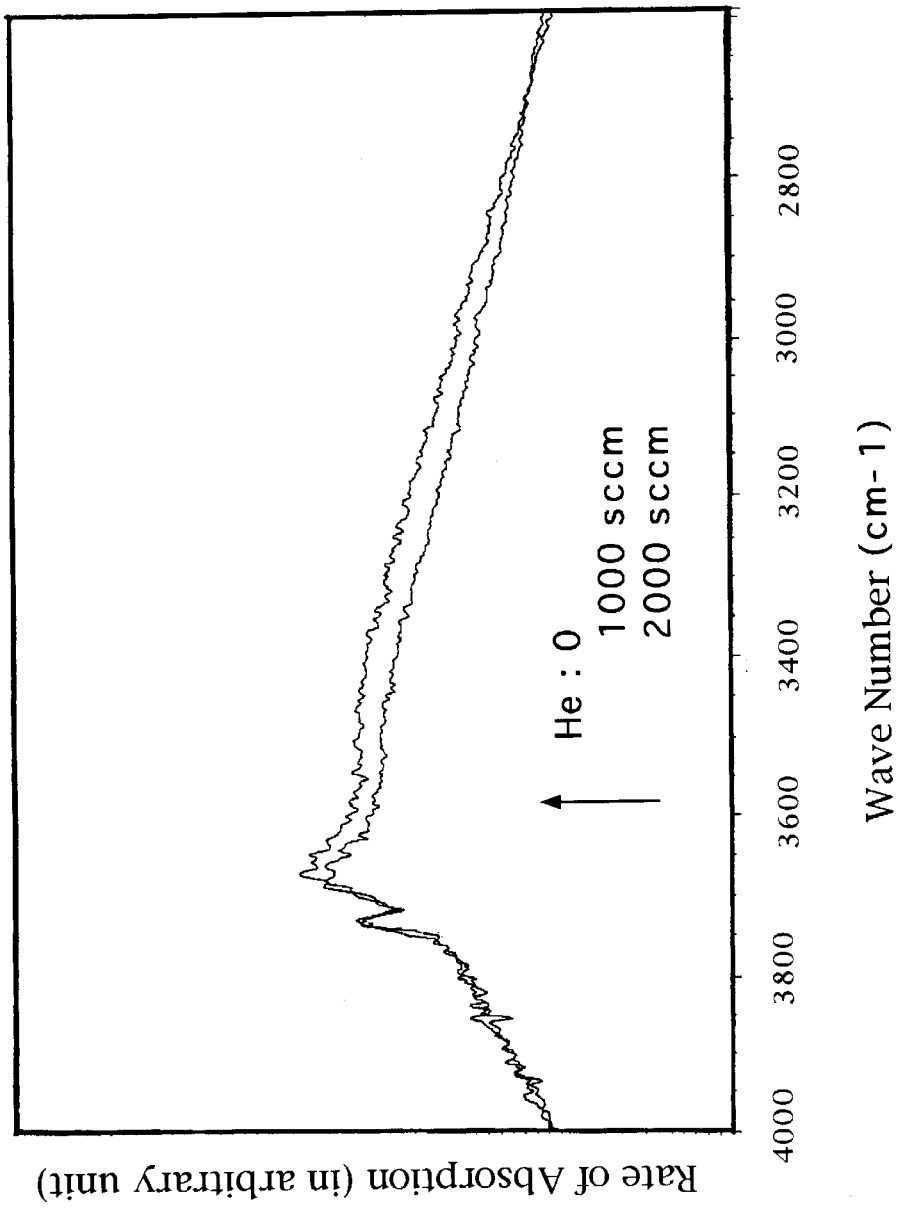
FIG. 3 is a graph showing a difference in moisture absorption characteristics of fluorine type silicon oxide films of a comparative example and an embodiment of the invention.

FIG. 3 shows profiles of infrared absorption indicating a difference in moisture absorption characteristics of the SiOF films of the comparative example and the embodiment of the invention. The experiment was carried out by measuring the infrared absorption spectra of the SiOF films after moistening them for three hours at the atmospheric pressure, a temperature of 80° C. and a humidity of 80%.

The graph of FIG. 3 shows the presence of substantially horizontal flat regions in the vicinity of a wave number of 3400 $cm^{-1}$. This indicates that molecules of water ($H_2O$) absorbed in the thin films are excited. Therefore, the higher the flat regions, the greater the amounts of moisture absorbed in the thin films. A comparison between the embodiment of the invention and the comparative example shows that an increase in the He flow rate from 0 sccm to 1000 sccm and another increase to 2000 sccm have lowered the flat regions. Specifically, it was revealed that the moisture absorption characteristics of the embodiment of the invention were suppressed when the He flow rate was approximately 7 times the total flow rate of TEOS and TEFS (1000 sccm) and were further suppressed when the He flow rate was approximately 14 times the same (2000 sccm). Results of another experiment (not shown) indicated that the effect of suppressing the moisture absorption characteristics of the thin film appeared at a He flow rate which is approximately 5 times the total flow rate of TEOS and TEFS. Further, the same result was obtained in another embodiment wherein the ratio between the silicon source gas and the silicon type fluorine source gas was changed. That is, although the ratio between the silicon source gas and the silicon type fluorine source gas varies depending on the requirements for the device for which they are to be used, the moisture absorption characteristics of a film are suppressed by adding an inert gas at a flow rate which is at least five times the total flow rate of them.

Table 2 shows results of measurement on the compression stress of the SiOF films of the embodiment of the invention and the comparative example.

TABLE 2

| | He (sccm) | Compression Stress (× 10E8 Pascal) |
|---|---|---|
| Comparative Example | 0 | −0.82 |
| Embodiments | 1000 | −1.37 |
| | 2000 | −1.57 |

The above results of measurement indicate that the compression stress of an SiOF film is increased from the value obtained at the He flow rate of 0 sccm by a factor of about 1.7 when the He flow rate is 1000 sccm and by a factor of about 1.9 when the He flow rate is 2000 sccm. Results of another experiment (not shown) indicated that such an effect of increasing the compression stress of a film appeared at a He flow rate which is substantially five times the total flow rate of TEOS and TEFS and increased with increase in the flow rate of He.

As described above, by means of a fluorine type silicon oxide film according to the invention, it is possible to provide a layer insulation film in which fluorine atoms are stable and to thereby improve the reliability of a semiconductor device.

By means of a fluorine type silicon oxide film according to the invention, it is possible to provide a layer insulation film having lower moisture absorption characteristics and to thereby provide a device having a longer life subjected to less deterioration.

Further, by means of a fluorine type silicon oxide film according to the invention, it is possible to provide a layer insulation film having high compression stress. This makes it possible to suppress a reduction of the yield of such films.

Furthermore, according to the method of manufacturing a fluorine type silicon oxide film according to the invention, manufacture can be sufficiently carried out using a conventional diode parallel plate plasma enhanced CVD apparatus whose running cost is low. This makes it possible to provide a reliable semiconductor device at a very low cost.

Although the present invention has been described with reference to a preferred embodiment thereof, those skilled in the art will recognize that changes may be made in form and detail without departing from the spirit and scope of the invention.

What is claimed is:

1. A method of forming a fluorinated silicon oxide film on a substrate, comprising the steps of:

providing as a material gas, a silicon source gas, a fluorinated silicon source gas, an oxidizing agent, and an inert gas, into a reaction chamber to flow onto a surface of the substrate placed inside the chamber, said inert gas flowing into the chamber at a flow rate at least five times that of the sum of the silicon source gas and the fluorinated silicon source gas to stabilize fluorine-silicon bonding when a fluorinated silicon oxide film is formed; and conducting chemical vapor deposition using the foregoing gases to form a fluorinated silicon oxide film on the surface of the substrate.

2. The method according to claim 1, wherein said silicon source gas is tetraethylorthosilicate (TEOS), said fluorinated silicon source gas is fluorotriethoxysilane (TEFS), said oxidizing agent is oxygen, and said inert gas is a helium or argon gas.

3. The method according to claim 1, wherein said substrate is a semiconductor wafer.

4. The method according to claim 1, wherein the gas providing step comprises preparing separately the silicon source gas, the fluorinated silicon source gas, the oxidizing agent, and the inert gas, mixing the forgoing gases, and introducing the mixed gas into the chamber.

5. The method according to claim 1, wherein the inert gas flow is at least seven times that of the sum of the sum of the silicon source gas and the fluorinated silicon source gas.

* * * * *